United States Patent [19]

Pugh

[11] Patent Number: 5,122,943
[45] Date of Patent: Jun. 16, 1992

[54] ENCAPSULATED LIGHT EMITTING DIODE AND METHOD FOR ENCAPSULATION

[75] Inventor: Jerry T. Pugh, Elkhart, Ind.

[73] Assignee: Miles Inc., Elkhart, Ind.

[21] Appl. No.: 684,833

[22] Filed: Apr. 15, 1991

[51] Int. Cl.$^5$ ............................................. F21V 13/10
[52] U.S. Cl. ..................................... 362/256; 362/248; 362/800; 362/363
[58] Field of Search ............... 362/363, 242, 248, 800, 362/255, 256

[56] References Cited

U.S. PATENT DOCUMENTS

| | | | |
|---|---|---|---|
| 4,698,730 | 10/1987 | Sakai et al. | 362/800 |
| 4,712,163 | 12/1987 | Oxley | 362/800 |
| 4,733,335 | 3/1988 | Serizewe et al. | 362/800 |
| 4,742,432 | 5/1988 | Thillays et al. | 362/800 |
| 5,001,609 | 3/1991 | Gardner et al. | 362/800 |

FOREIGN PATENT DOCUMENTS 0241155  11/1986  Fed. Rep. of Germany ...... 362/800

*Primary Examiner*—Ira S. Lazarus
*Attorney, Agent, or Firm*—Roger N. Coe

[57] ABSTRACT

A light emitting diode with reduced stray light includes a base with an active light emitting element mounted in the base. An epoxy envelope is mounted on the base. The envelope includes a conical side portion and a spherical dome portion. The envelope is encapsulated with optically absorbing material of low reflectivity. The optically absorbing material is in direct contact with the side portion of the envelope and part of the spherical dome portion leaving an exposed portion through which rays of light pass. The diameter d of the exposed portion is equal to: $2r[\sin(x+\arcsin(r/s/n))]$, wherein r is the radius of a spherical dome portion, $x < \arcsin(1/n)$ is the maximum angle between a surface normal and a ray emitted from the active light emitting element that strikes the envelope at the edge of the exposed portion of the spherical dome portion, s is the distance between the active light emitting element and the center of the spherical dome portion, and n is the index of refraction of the material of the epoxy envelope.

8 Claims, 4 Drawing Sheets

ENCAPSULATED LIGHT EMITTING DIODE AND METHOD FOR ENCAPSULATION

BACKGROUND OF THE INVENTION

1. Field of the Invention

The present invention relates to a new and improved light emitting diode that is encapsulated with optically absorbing material to reduce stray light, and to a new and improved method for encapsulating a light emitting diode to reduce stray light.

2. Description of the Background Art

In designing blood glucose monitoring instruments, the direction of development has been toward smaller instruments that are lower in cost. To meet these goals, more than one function is designed into a single component. This approach lowers the part count, reduces the size of the instrument and increases the reliability.

One example of this trend is the use of a light emitting diode (LED) to replace the combination of an incandescent lamp, and an interference filter in the optical system of blood glucose monitoring instruments. Examples of instruments that use an LED as a light source include the GLUCOMETER III manufactured by Miles, Inc., the ACCUCHECK manufactured by Boehringer Mannheim GmbH and the GLUCOSCAN manufactured by Lifescan, Inc. Examples of devices using an LED in a readhead are to be found in U.S. Pat. Nos. 4,552,458; and 4,676,653 and European Patent Application No. 83304306.6, filed Jul. 26, 1983. LED light sources have also been used in other diagnostic instruments such as the instrument disclosed in U.S. Pat. No. 4,755,058. The typical LED used as a light source in the readhead of a blood glucose monitoring system is the standard T-1¾ which can be purchased from manufacturers such as the ES Series made by Stanley Electric Co., Ltd. or the HLMP Series from Hewlett-Packard.

One of the problems in using a standard LED as a light source in a blood glucose monitoring instrument is the stray light emitted by the LED. In a diagnostic instrument readhead it is preferable that the LED emission be generally collimated toward a small sample area. Rays emitted at wide angles are undesirable stray light that preferably are minimized or eliminated, since stray light in an optical system of a readhead instrument manifests itself as a background signal.

At least three procedures have been used in instruments to control the stray light from an LED. One method is to ignore the existence of stray light. By ignoring the stray light, however, there can be a high level of instrument to instrument imprecision. Due to this imprecision, ignoring the stray light has not been considered an acceptable method.

Another method of controlling stray light is to accept only a small solid angle of the emission from an LED. Such an approach is used in the instrument described in U.S. Pat. No. 4,676,653. This approach results in an instrument that uses only a small portion of the available light from the LED. This approach also reduces the magnitude of the available signal and can make the optical system more susceptible to noise.

Another approach is to use a shield to avoid the detection of the stray light. Such an approach is illustrated in European Patent Application No. 83304306.6. This approach does not shield the stray light flaring in directions other than in direct line with the shield. Commuter simulations have been performed that suggest that there is a significant amount of this light that flares in all directions after emission from an LED, and for this reason, shielding is not preferred.

SUMMARY OF THE INVENTION

Briefly, the present invention is directed to a new and improved light emitting diode used in an instrument readhead such as in a blood glucose monitoring instrument. The LED may be of the standard type such as a T-1¾ plastic LED lamp that includes a base with anode and cathode leads extending from the base to a location above the base. An active light emitting element is encapsulated within an epoxy envelope that is secured on the base. The epoxy envelope includes a conical side portion and a spherical dome portion or lens that extends above the side portion and encloses the envelope.

To reduce the amount of stray light emitted by the active light emitting element, the side portion and part of the spherical dome portion are encapsulated by optically absorbing material. This material is placed in direct contact with the envelope leaving an exposed portion of the spherical dome portion. Preferably, this encapsulation of the envelope is done such that the diameter of the exposed portion is equal to $2r[\sin(x+\arcsin(r/s/n))]$ wherein r is the radius of the spherical dome portion, $x < \arcsin(1/n)$ is the maximum angle between a surface normal and a ray emitted from the active light emitting element that strikes the envelope at the edge of the exposed portion of the spherical dome, s is the distance between the active light emitting element and the center of the spherical dome portion, and n is the index of refraction of the epoxy material that defines the envelope.

BRIEF DESCRIPTION OF THE DRAWINGS

Other objects and advantages of the present invention will become apparent upon reading the following detailed description and upon reference to the drawings in which.

DESCRIPTION OF THE PREFERRED EMBODIMENT

Figure 1:
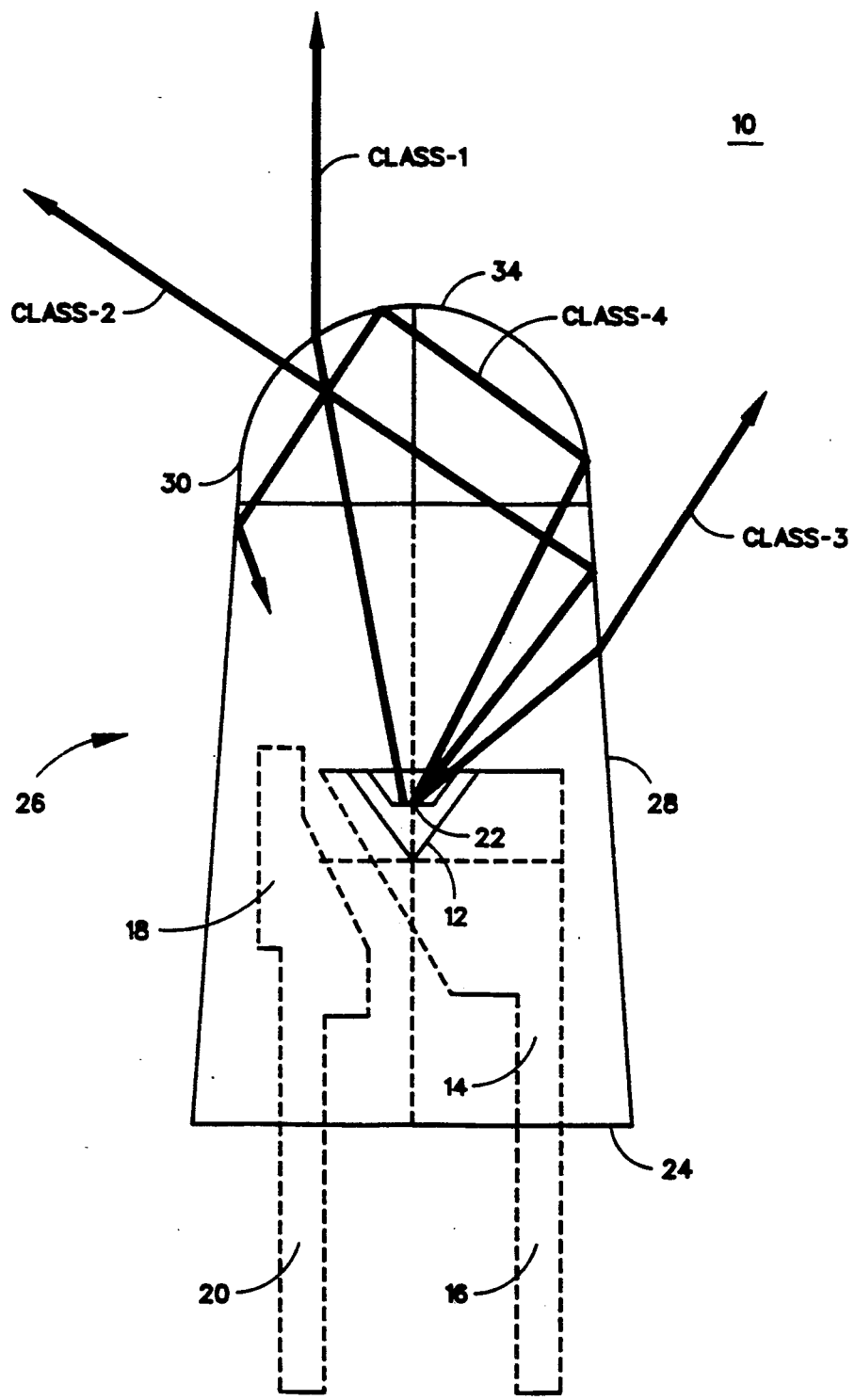
FIG. 1 is a schematic illustration of a light emitting diode and the paths of different classes of rays of light.

Referring initially to FIG. 1, there is illustrated a standard T-1¾ plastic LED lamp generally designated by the reference numeral 10. Only the elements of the LED 10 that are necessary for an understanding of the present invention will be described.

The LED 10 includes a reflector dish 12 coined onto a cathode post 14. The cathode post 14 is part of a cathode lead 16 extending downwardly from the LED 10. The LED 10 also includes an anode post 18 that extends from the LED 10 to an anode lead 20.

The LED 10 includes an LED chip or active light emitting element 22 electrically connected to the reflector dish 12 and the anode post 18. The active light emitting element 22 is positioned above a base 24 of the LED 10 and is encapsulated in or covered by an epoxy resin envelope generally designated by the reference numeral 26. The epoxy envelope 26 includes a tapered or conical side portion 28 and an upper spherical dome portion 30. The base 24 encloses the lower end of the epoxy envelope 26, and the spherical dome portion 30 encloses the upper end of the epoxy envelope 26. In addition, the upper spherical dome portion 30 functions as a magnifying lens for the rays of light emitted from the active light emitting element 22. Although a T-1¾ LED lamp is illustrated and disclosed, it is intended to be recognized that other LED's with other shaped domes, for example, a parabolic surface of revolution, are included in this invention as long as the diameter d of the shape limits the angle x to less than arcsin (1/n).

As best illustrated in FIG. 1, the light rays emanate from the active light emitting element 22, strike the various optical surfaces, and are refracted by the epoxy resin envelope 26. A computer simulation for an LED without a reflecting cone was used to determine that the rays emitted from the active light emitting element 22 can be grouped into four classes. Class 1 rays are refracted by the spherical dome portion 30 of the epoxy resin envelope 26. Class 1 rays make up about 29% of the total rays, and are the most useful rays in an instrument readhead application since they remain generally collimated at some distance from the LED 10. Class 2 rays are refracted by the spherical dome portion 30 of the epoxy resin envelope 26 after first being internally reflected by the side portion 28 of the epoxy resin envelope 26. Class 2 rays make up about 19% of the total rays. Class 2 rays are not useful in an instrument readhead application as they form a ring which diverges widely upon leaving the LED 10.

Class 3 rays pass through and are refracted by the side portion 28 of the epoxy resin envelope 26. Class 3 rays make up about 28% of the total rays, and are not useful as they also form a wide diverging background upon leaving the LED 10.

Class 4 rays are internally reflected by the epoxy resin envelope 26 and make up the remaining 24% of the total number of rays. As with class 2 and 3 rays, class 4 rays are not useful in an instrument readhead application since they exit the back of the LED 10.

Figure 2:
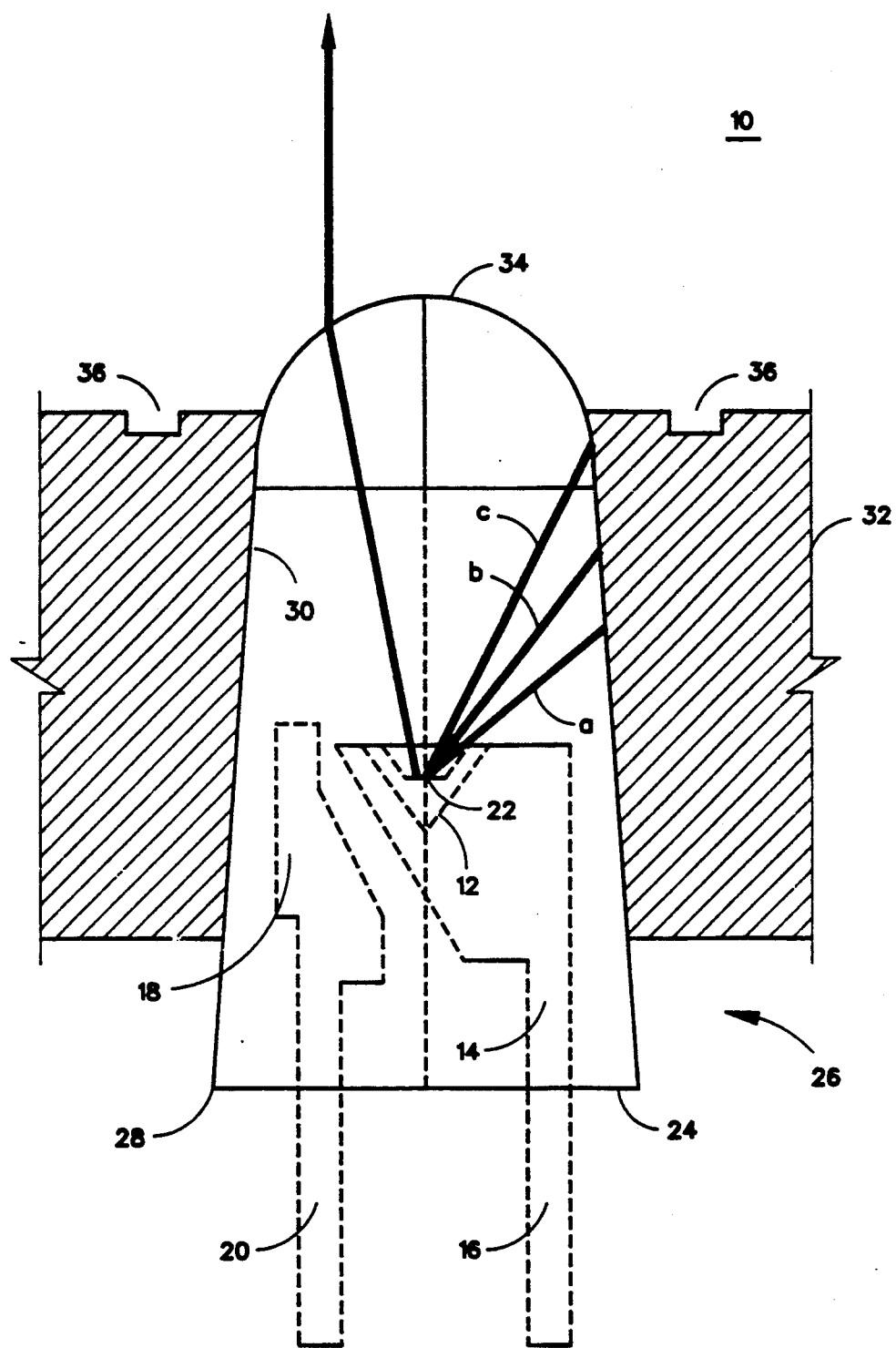
FIG. 2 is a schematic illustration of a light emitting diode similar to FIG. 1 including optically absorbing material encapsulating the light emitting diode and illustrating the path of the different classes of rays of light.
Figure 3:
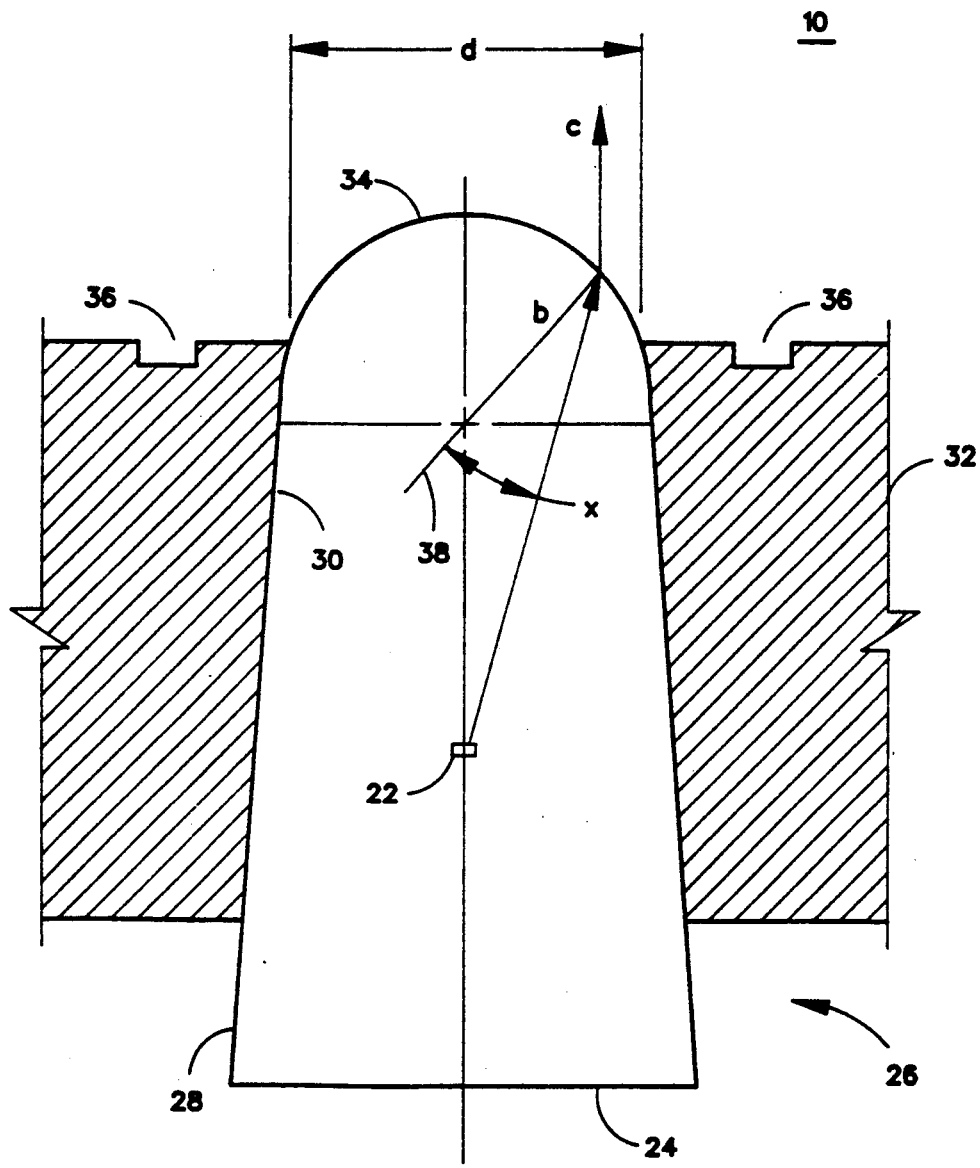
FIG. 3 is a schematic illustration similar to FIG. 2 illustrating different dimensions of the light emitting diode.
Figure 4:
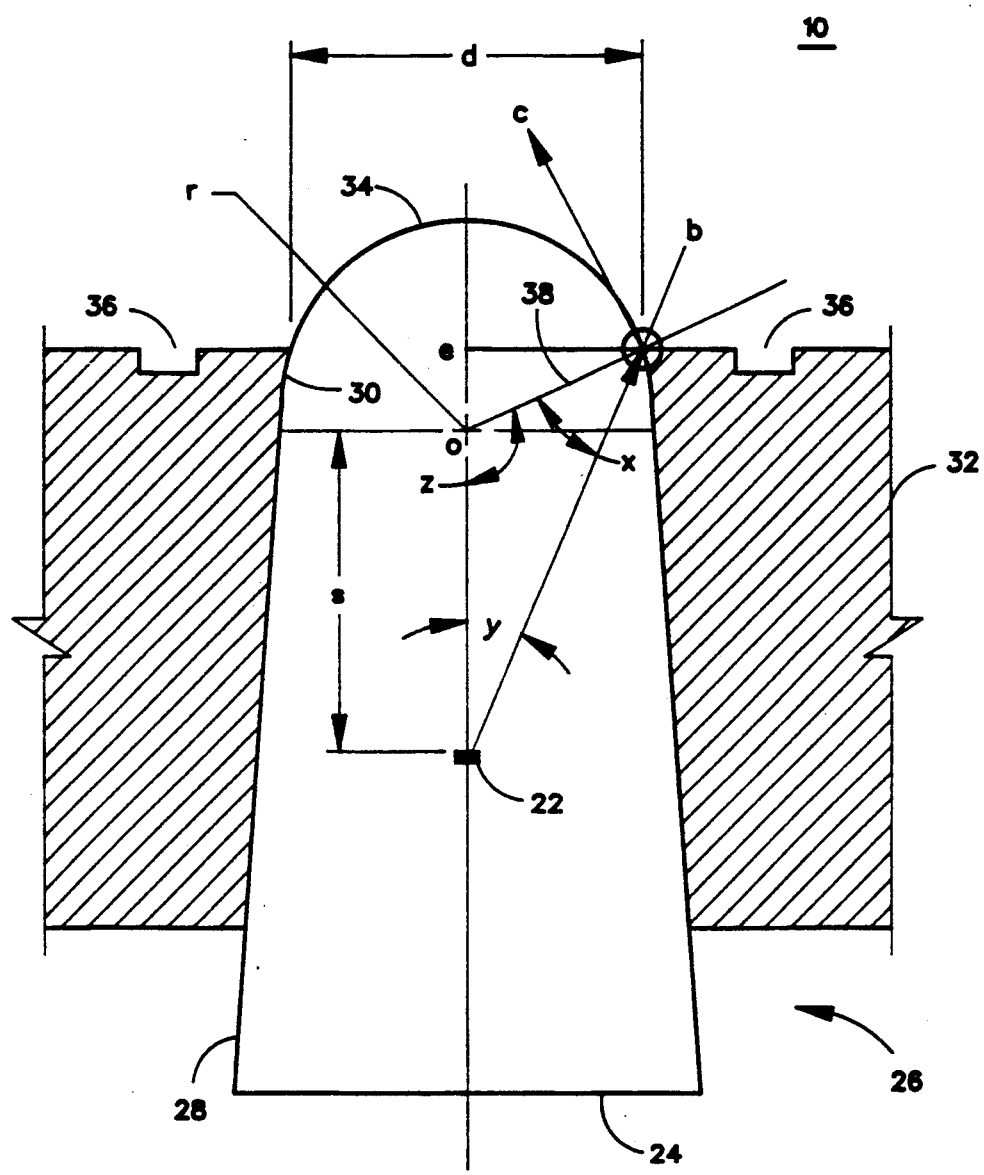
FIG. 4 is a schematic illustration of the dimensions of different portions of the epoxy envelope of the light emitting diode of the present invention and the path and angles of light rays used to calculate the exposed portion of the envelope uncovered by the optically absorbing material.

In order to maximize the effectiveness of an LED 10 in an instrument readhead, it is desirable to prevent the class 2, class 3 and class 4 rays from exiting the LED 10. In the present invention, this is accomplished by encapsulating the LED 10 with an encapsulating material 32 (FIGS. 2-4). The encapsulating material 32 is preferably an optically absorbing material of a low reflectivity such as black plastic or black painted material and can be a sleeve that is slipped onto the LED 10 or it can be molded onto the LED 10. The encapsulating material 32 completely surrounds and is in direct contact with the side portion 28 of the epoxy resin envelope 26. In addition, the encapsulating material surrounds and is in direct contact with at least a portion of the spherical dome portion 32 leaving an exposed portion 34 through which class 1 rays may pass. In a preferred embodiment, the encapsulating material 32 may include snaps or notches 36 that facilitate the retention of the encapsulated LED 10 in an optical readhead of an instrument.

The encapsulating material 32 prevents the class 2, class 3 and class 4 rays from exiting the LED 10. As an example, the encapsulating material 32 absorbs the class 3 rays that would otherwise be refracted through the side portion 28 of the epoxy resin envelope 26 at the point a in FIG. 2. Also, the encapsulating material 32 frustrates the total internal reflection of class 2 and 4 rays at point b and point c, respectively, in FIG. 2. This is accomplished by lowering the internal reflectance from 100% to the reflectance of the encapsulating material 32.

The result of the use of the encapsulating material is that only class 1 rays as illustrated in FIG. 2 pass through the exposed portion 34 of the epoxy resin envelope 26, and these are the most useful and effective light rays emitted by the LED 10. Thus, the encapsulated LED 10 provides the best light source for an instrument readhead by preventing unwanted rays from exiting the LED 10.

Significantly less aperturing is required in the illumination optics of an instrument readhead in which the encapsulated LED 10 is incorporated. This less aperturing allows more of the class 1 rays to illuminate a sample. For example, a computer simulation has shown that a 2.5 to 3 fold increase in signal level is possible by encapsulating a LED 10.

In order to insure that the class 2, class 3 and class 4 rays are prevented from exiting the LED 10, the diameter d (FIGS. 3 and 4) of the exposed portion 34 of the epoxy resin envelope 26 must be calculated and maintained during encapsulation. The diameter d of the exposed portion 34 must be sized such that the rays emitted from the active light emitting element 22 that strike the surface of the epoxy resin envelope 26 inside this diameter (for example, ray 22-b in FIG. 3) are not internally reflected, but are refracted out of the epoxy resin envelope 26 (for example, the ray b-c in FIG. 3). In order to insure that a ray is not internally reflected, the angle the ray makes with a surface normal 38, such as the angle x in FIGS. 3 and 4, must be less than a critical angle given by the formula: $\sin(x) < 1/n$; where n is the index of refraction of the epoxy material of the envelope 26. If the worse case ray 22-b-c shown in FIG. 4 is considered, from the triangle b-o-e the formula can be written: $d/2 = r[\sin(180-z)]$, but $180-z = x+y$, therefore, $d = 2r[\sin(x+y)]$. From the law s of sines we know: $r\sin(x) = s[\sin(y)]$, or: $y = \arcsin[r(\sin(x)/s)]$, and substitution gives: $d = 2r[\sin(x + \arcsin(r/s/n/))]$, where $x < \arcsin(1/n)$. In a typical example with $r = 0.079$ inch, $s = 0.123$ inch, and $n = 1.5$, the equation results in $x = 41.8$ degrees and $d = 0.146$ inch. Through this calculation, the diameter d of the exposed portion 34 of the preferred encapsulated LED 10 can be determined, and encapsulated light emitting diodes 10 can be manufactured in quantity with consistency. The light emitting diodes 10 may then be used in instrument readheads providing the best available light source.

I claim:

1. An encapsulated light emitting diode, comprising:
   an LED lamp, an active light emitting element in said LED lamp, said LED lamp including an envelope;
   said envelope including a side portion, and a spherical end; and
   encapsulating material covering said side portion;
   wherein said encapsulating material is black.

2. An encapsulated light emitting diode, comprising:
   an LED lamp, an active light emitting element in said LED lamp, said LED lamp including an envelope;

said envelope including a side portion, and a spherical end; and encapsulating material covering said side portion;

wherein said encapsulating material further covers at least part of said spherical end leaving an exposed diameter portion having a diameter equal to $2r[\sin(x+\arcsin(r/s/n))]$ wherein r is the radius of said spherical end, $x < \arcsin(1/n)$ is the maximum angle between a surface normal and a ray emitted from the active light emitting element that strikes the envelope at an edge of the exposed portion of the spherical end, s is the distance between the active light emitting element in said LED lamp and the center of the spherical end, and n is the index of refraction of the material of said envelope.

3. A light emitting diode encapsulated for reduced stray light, comprising:

a base, an active light emitting element mounted on said base;

an envelope with a conical side portion, said conical side portion mounted on said base;

said envelope including a spherical dome end extending from said conical side portion; and encapsulating material surrounding said conical side portion and part of said spherical dome end with an exposed portion of said spherical dome end uncovered by said encapsulating material;

wherein the diameter of the exposed portion of said spherical dome is equal to $2r[\sin(x+\arcsin(r/s/n))]$ wherein r is the radius of said spherical dome end, $x < \arcsin(1/n)$ is the maximum angle between a surface normal and a ray emitted from the active light emitting element that strikes the envelope at the edge of the exposed portion of the spherical dome, s is the distance between said active light emitting element and the center of said spherical dome end, and n is the index of refraction of the material of said envelope.

4. A light emitting diode encapsulated for reduced stray light, comprising:

a base, an active light emitting element mounted on said base;

an envelope with a conical side portion, said conical side portion mounted on said base;

said envelope including a spherical dome end extending from said conical side portion; and encapsulating material surrounding said conical side portion and part of said spherical dome end with an exposed portion of said spherical dome end uncovered by said encapsulating material;

wherein said encapsulating material is in contact with said conical side portion and part of said spherical dome end.

5. An encapsulated light emitting diode, comprising:

a light emitting diode in an envelope having a side portion and an end portion, and an encapsulating material covering said side portion;

wherein said encapsulating material is an optically absorbing material which absorbs class, 2, class 3 and class 4 rays emitted from said light emitting diode.

6. A method of reducing stray light emitted from a light emitting diode wherein said light emitting diode includes an active light emitting element mounted within an envelope including a side portion and a spherical end portion, the method comprising the steps of:

encapsulating said side portion of said envelope with material of low reflectivity;

encapsulating a portion of said spherical end portion of said envelope with said material of low reflectivity leaving an exposed portion; and applying the material of low reflectivity in direct physical contact with said side portion and said spherical end portion.

7. A method of reducing stray light emitted from a light emitting diode wherein said light emitting diode includes an active light emitting element mounted within an envelope including a side portion and a spherical end portion, the method comprising the steps of:

encapsulating said side portion of said envelope with material of low reflectivity; and encapsulating a portion of said spherical end portion of said envelope with said material of low reflectivity leaving an exposed portion;

wherein the step of encapsulating a portion of the spherical end portion of said envelope further includes leaving said exposed portion with a diameter equal to $2r[\sin(x+\arcsin(r/s/n))]$ wherein r is the radius of the spherical end portion, $x < \arcsin(1/n)$ is the maximum angle between a surface normal and a ray emitted from the active light emitting element that strikes the envelope at the edge of the exposed portion of said spherical end portion, s is the distance between the active light emitting element and the center of the spherical end portion, and n is the index of refraction of the envelope.

8. A method of reducing stray light exiting an envelope of a light emitting diode wherein said envelope includes a side portion and a dome portion and said light emitting diode includes an active light emitting element mounted within said envelope, the method comprising the steps of:

absorbing rays of light emitted from said active light emitting element and refracted by said side portion of said light emitting diode envelope, and lowering the internal reflectance of said envelope;

wherein said steps of absorbing rays of light emitted by an active light emitting element and lowering the internal reflectance include encapsulating said side portion of said envelope and part of said dome portion of said envelope with an optically absorbing material leaving an exposed portion of said dome portion, the diameter of said exposed portion being equal to $2r[\sin(x+\arcsin(r/s/n))]$ wherein r is the radius of said dome portion, $x < \arcsin(1/n)$ is the maximum angle between a surface normal and a ray emitted from the active light emitting element that strikes the envelope at the edge of the exposed portion of the dome portion, s is the distance between said active light emitting element and the center of said dome portion, and n is the index of refraction of said envelope.

* * * * *